United States Patent [19]
Thomas et al.

[11] Patent Number: 5,336,993
[45] Date of Patent: Aug. 9, 1994

[54] ASSEMBLY FOR TESTING RECTIFIERS AND REGULATORS OF AUTOMOTIVE ALTERNATORS

[76] Inventors: Richard E. Thomas, 47A Apple Tree La., Old Bridge, N.J. 08857; Arthur R. Besozzi, 30-29 85th St., Jackson Heights, N.Y. 11370

[21] Appl. No.: 942,186

[22] Filed: Sep. 9, 1992

[51] Int. Cl.⁵ .............................................. G01R 31/00
[52] U.S. Cl. ............................... 324/158.1; 324/772; 324/767
[58] Field of Search ...... 324/158 MG, 158 D, 158 R, 324/73.1, 546; 364/550.1; 318/490; 322/99; 340/645, 648

[56] References Cited

U.S. PATENT DOCUMENTS 3,893,029  7/1975  Vensel et al. ............... 324/158 MG
4,070,624  1/1978  Taylor ......................... 324/158 MG
4,156,845  5/1979  Muellner et al. ........... 324/158 MG
4,178,546 12/1979  Hulls et al. .................. 324/158 MG
4,459,548  7/1984  Lentz et al. ................. 324/158 MG

*Primary Examiner*—Vinh Nguyen
*Attorney, Agent, or Firm*—Ezra Sutton

[57] ABSTRACT

A test assembly for testing regulators and rectifiers. The assembly includes two main components: a modified alternator and a test board. The test board has a regulator test station, which is electrically connected to the rotor of the modified alternator, and it has a rectifier test station, which is electrically connected to the stator of the modified alternator. The modified alternator is run on a conventional alternator tester and its meter observed. This testing assembly allows regulators and rectifiers to be tested individually at a high amperage (full load) before they are assembled into an alternator.

22 Claims, 5 Drawing Sheets

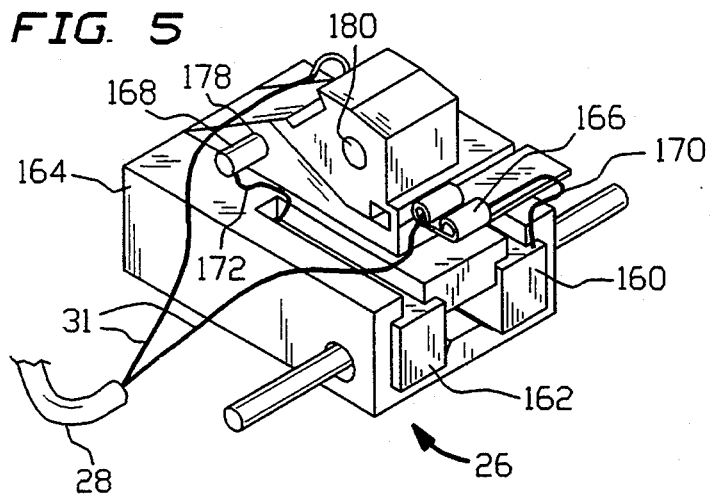
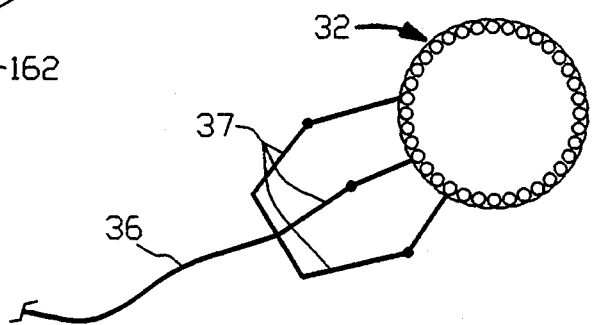
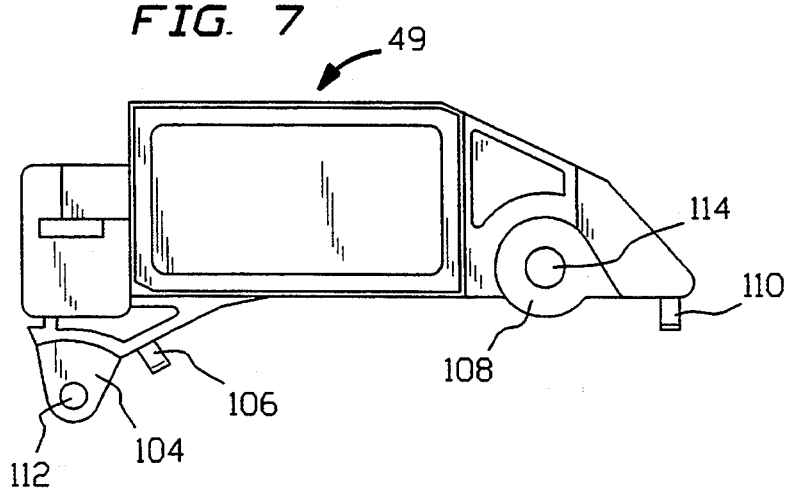
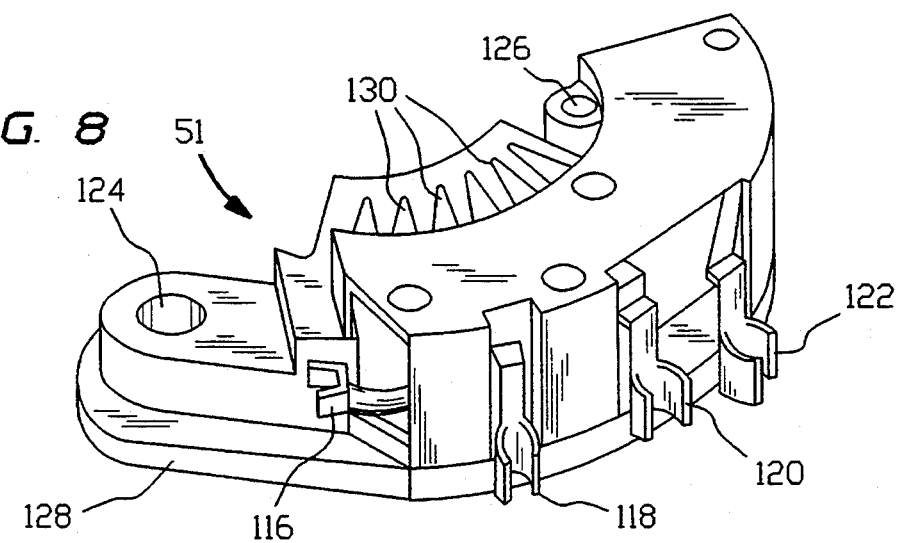

ASSEMBLY FOR TESTING RECTIFIERS AND REGULATORS OF AUTOMOTIVE ALTERNATORS

FIELD OF THE INVENTION

The present invention relates to a testing assembly for testing rectifiers and regulators of certain alternators.

BACKGROUND OF THE INVENTION

When rebuilding alternators, such as General Motors' CS-130, there is a need to test salvaged regulators and rectifiers before they are installed into rebuilt units. Presently, regulators and rectifiers can only be tested under full load after they are installed in a rebuilt alternator or by using equipment which is much more costly than the invention presented here. The former method has several disadvantages, especially in terms of labor and time.

If a rebuilt alternator tests bad, the unit must be disassembled to replace the salvage regulator with another regulator. The unit would then be re-assembled and tested again. If the unit fails again, the unit must be disassembled to replace the salvage rectifier with another rectifier. Once again, the unit would be re-assembled and tested. The unit has to be taken apart and re-assembled each time to replace and test each individual part, so that the problem can be identified through the process of elimination.

It would be desirable to eliminate the excessive labor and time involved in testing regulators and rectifiers, as described above.

It is an object of the present invention to provide an inexpensive testing assembly which will test regulators and rectifiers before they are installed into a rebuilt alternator.

It is also an object of the present invention to provide a testing assembly that includes a modified alternator, a regulator test station, and a rectifier test station.

SUMMARY OF THE INVENTION

In accordance with the principles of the present invention, there is provided a device for testing regulators and rectifiers before installation into a rebuilt alternator. A regulator test station and a rectifier test station are electrically connected to a modified alternator, which is attached by a pulley and belt to an alternator tester, so that voltage and current readings can be obtained.

The present invention consists of: a modified alternator, hereinafter referred to as a drive alternator, spun by a conventional alternator tester, wherein the drive alternator includes a two-conductor wire and plug in place of a regulator and a three-conductor wire and plug in place of a rectifier; a test board, which contains a regulator test station and a rectifier test station for receiving and testing regulators and rectifiers, respectively.

The regulator test station includes means for clamping, mounting, and electrically contacting a test regulator to the test station. The rectifier test station includes means for clamping, mounting, and electrically contacting a test rectifier to the test station.

BRIEF DESCRIPTION OF THE DRAWINGS

Further objects, features, and advantages of the present invention will become apparent upon consideration of the detailed description of the presently-preferred embodiment, when taken in conjunction with the accompanying drawings, wherein:

FIG. 5 shows a modified brush assembly, hereinafter referred to as a brush assembly, and connection to a test board wire;

FIG. 6 illustrates the connection between the stator and a test board wire;

FIG. 7 shows a regulator to be tested; and

FIG. 8 shows a rectifier to be tested.

DETAILED DESCRIPTION OF THE PREFERRED EMBODIMENT

Figure 1:
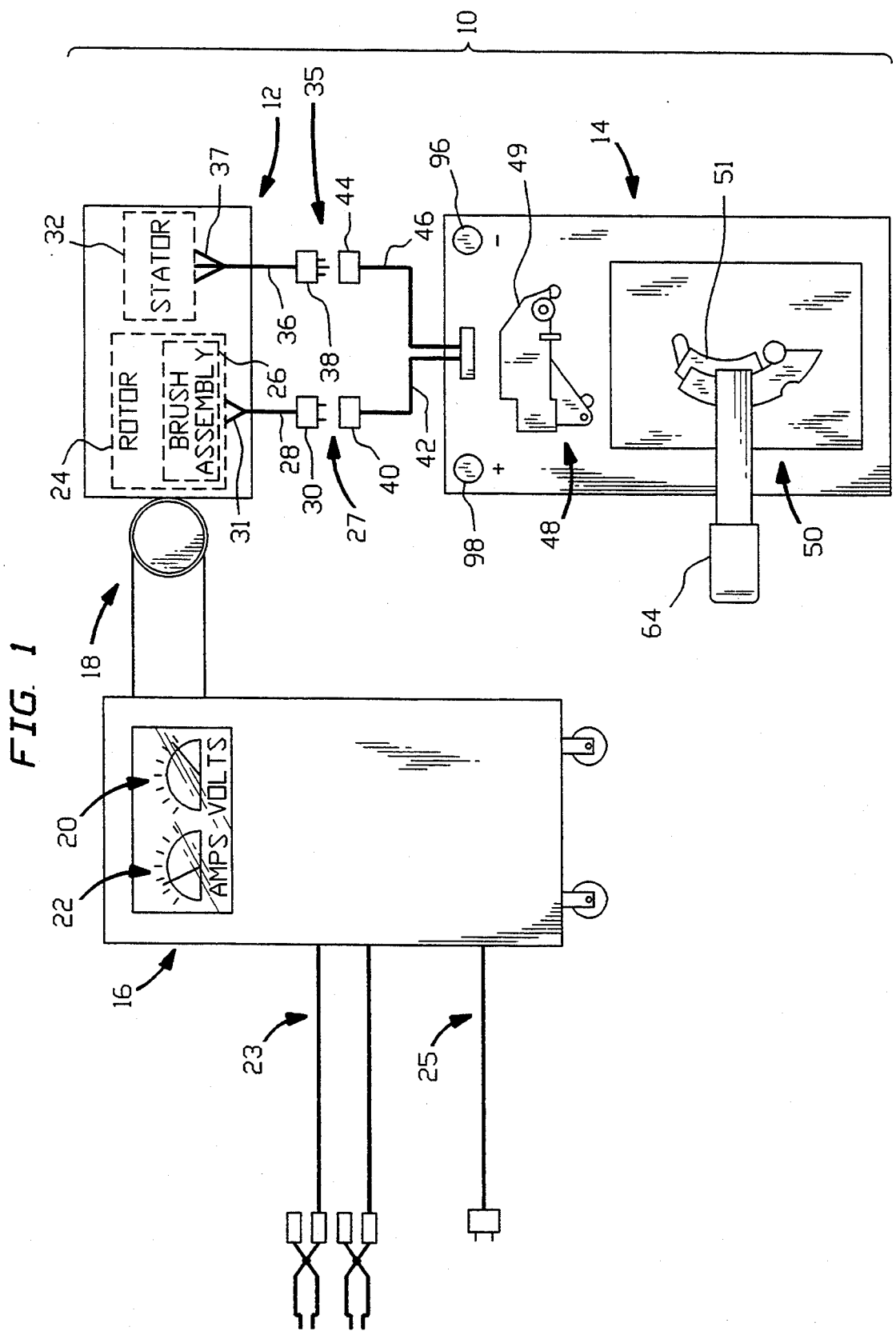
FIG. 1 is a diagrammatic view, illustrating the testing assembly and how the individual members attach and work in conjunction with an alternator tester.

Referring to FIG. 1, there is shown a testing assembly 10 embodying the principles of the present invention. The testing assembly 10 is comprised of a drive alternator 12 and a test board 14. The testing assembly 10 is attached to an alternator tester 16 by a pulley and belt 18.

The drive alternator 12 consists of a rotor 24, a stator 32, a brush assembly 26, a brush/test board wire 28 with plug 30, and a stator/test board wire 36 with plug 38. The rotor 24 contacts the brush assembly 26, and the brush assembly 26 is connected to the two conductors 31 of brush/test board wire 28 in place of the regulator 49. Wire 28 terminates in a two-conductor plug 30, which forms half of connector 27. The stator 32 is connected to the three conductors 37 of stator/test board wire 36 in place of the rectifier 51. Wire 36 terminates in a three-conductor plug 38, which forms half of connector 35. The drive alternator 12 is spun by a conventional alternator tester 16 via a pulley and belt 18 attached to the rotor 24 of the drive alternator 12. Voltage readings 20 and current readings 22 are displayed by the alternator tester 16 to show if the regulator 49 and/or the rectifier 51 being tested are functioning at sufficient voltage and current levels or are defective and must be replaced. Positive and negative cables 23 from alternator tester 16 are attached to positive terminal 98 and negative terminal 96, respectively, on test board 14 during testing. Regulator wire 25 from alternator tester 16 is attached to regulator 49 during testing.

The test board 14 connects to the drive alternator 12 by means of brush/test board connector 27 and stator/test board connector 35. Receptacle 40 attaches to plug 30, and receptacle 44 attaches to plug 38. The test board/brush wire 42 leads from receptacle 40 to the test board 14. Similarly, the test board/stator wire 46 leads from receptacle 44 to the test board 14.

The test board 14 includes a regulator test station 48 for receiving and testing a regulator 49 and a rectifier test station 50 for receiving and testing a rectifier 51.

Figure 2:
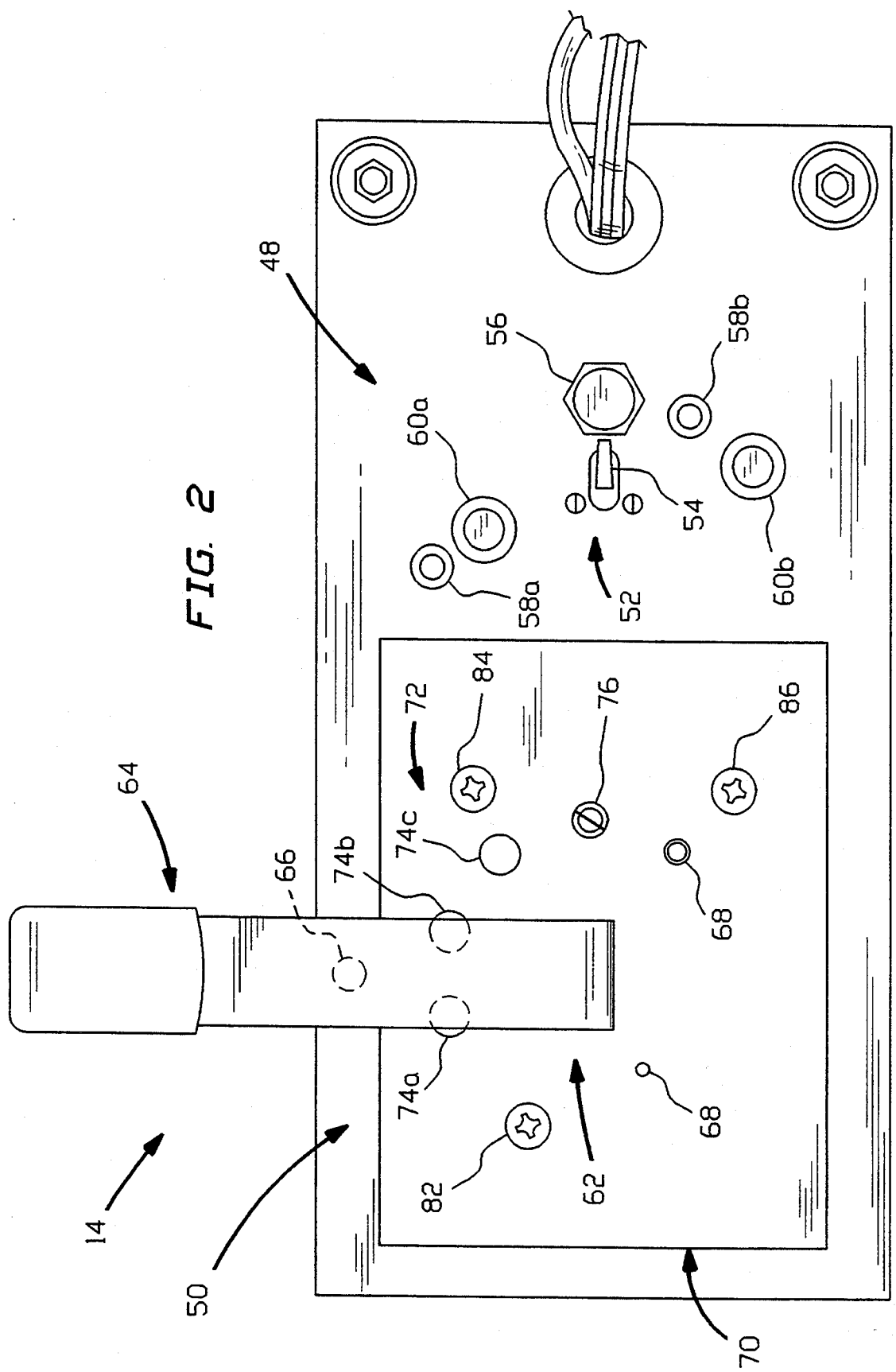
FIG. 2 is a top view of the test board showing the regulator test station and rectifier test station.

Referring to FIGS. 2, 7, and 8 there is shown a top view of the test board 14, providing a detailed view of the regulator test station 48, the rectifier test station 50, a regulator 49, and a rectifier 51. The regulator test station 48 includes regulator clamping device 52 and regulator station electrical contacts 60a and 60b. The regulator station clamping device 52 consists of a spring-activated latch 54 and a stop 56. Mounting pins 58a and 58b are provided for receiving the test regulator 49 through regulator mounting holes 112 and 114. The regulator station mounting pins 58a and 58b also make electrical contact with the regulator 49 at contacts 104 and 108 and are spring activated. The regulator station electrical contacts 60 include a left, spring-activated plunge contact 60a and a right, spring-activated plunge contact 60b for making electrical contact with the test regulator 49 at contacts 106 and 110, respectively.

The rectifier test station 50 includes rectifier clamping device 62 for clamping the rectifier 51 to the rectifier test station 50, rectifier mounting means 68a and 68b for locating the rectifier 51 on the rectifier test station 50, a test station heat sink plate 70 to draw heat from the rectifier 51, by using the rectifier heat sink plate 128, and electrical contacts 72 for electrical contact with the test rectifier 51.

The rectifier clamping device 62 consists of a hand-actuated clamp 64 and a stop 66. Two locating pins 68a and 68b are provided for receiving the test rectifier 51 through the rectifier mounting holes 126 and 124, respectively. The clamping means 62 holds the test rectifier 51 down on the test station heat sink plate 70. The rectifier electrical contacts 72 include three copper clad and spring-activated plunge contacts 74a, 74b, 74c, and one spring-activated blade plunge contact 76 for electrical contact to the test rectifier 51 at contact points 122, 120, 118, and 116, respectively. Each of the electrical contacts 74a, 74b, 74c, 76 extend through the heat sink plate 70, which is mounted to the test board 14 by three threaded fasteners 82, 84, 86.

Figure 3:
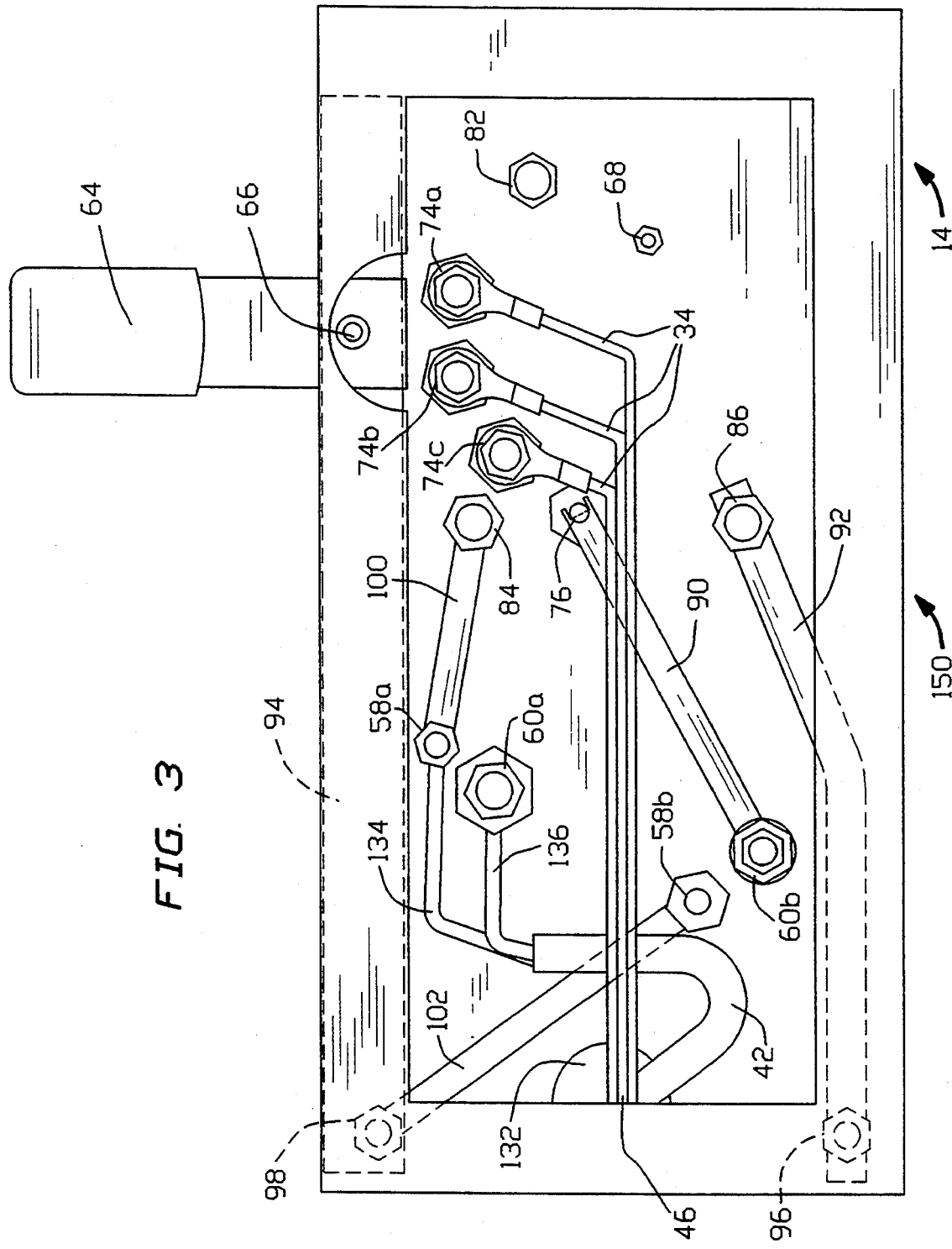
FIG. 3 is a bottom view of the test board showing how the individual members of the test stations are electrically connected.
Figure 4:
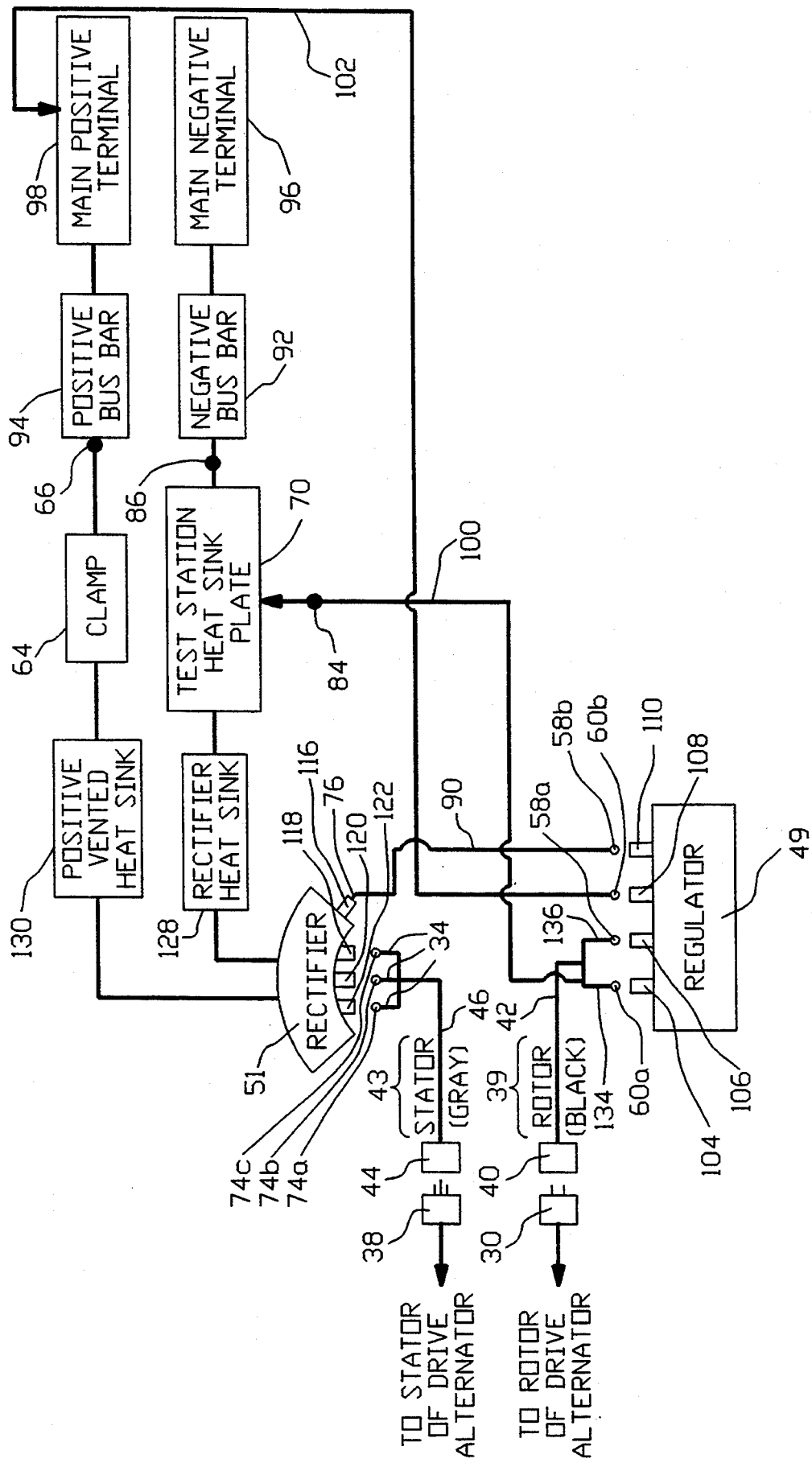
FIG. 4 is a schematic drawing of the electrical connections of the testing assembly.

Referring to FIGS. 3 and 4, there are provided diagrams of the electrical connections of the present invention. Viewing the underside 150 of the test board 14, as shown in FIG. 3, the test board/brush wire 42 enters through a cut out opening 132. The test board/brush wire 42 splits into two wires 134 and 136. Wire 134 contacts the regulator station 48 at the left mounting pin 58a, which electrically contacts the test regulator 49 at contact 104. Wire 136 makes electrical contact with the regulator station 48 at the left plunge contact 60a, which is in contact with regulator electric contact 106. A metal conducting bar 100 electrically connects the left mounting pin 58a to threaded fastener 84 of the test station heat sink plate 70 and therefore to the test station heat sink plate 70, as well. Threaded fastener 86 of test station heat sink plate 70 makes electrical contact with heat sink plate 70 and negative buss bar 92, which connects to the negative terminal 96.

Regulator electric contact 108 rests upon the right mounting pin 58b of the regulator test station 48 making an electrical contact. The right mounting pin 58b is fastened to diagonal metal conducting bar 102, which is also fastened to positive terminal 98 along with positive buss bar 94.

Regulator electric contact 110 contacts the right plunge contact 60b of the regulator test station 48. The right plunge contact 60b is electrically connected via a leaf spring 90 to the blade plunge contact 76 of the rectifier test station 50. The blade plunge contact 76 engages the rectifier 51 at contact 116. From the rectifier 51, connection is made to the positive terminal 98 and the negative terminal 96 through paths described below.

Contact is made with the negative terminal 96 from the rectifier 51 via the rectifier heat sink 128, located on the base of the rectifier 51. The rectifier heat sink 128 rests on the test station heat sink plate 70. The test station heat sink plate 70 electrically connects to the negative buss bar 92 by threaded fastener 86. The negative buss bar 92 is connected to the negative terminal 96.

Contact is made with the positive terminal 98 from the rectifier 51 via the positive vented heat sink 130 of the rectifier 51. The hand-actuated clamp 64 contacts the positive heat sink 130 and conducts electricity to the positive buss bar 94 by the stop 66 to which it is attached, located beneath the clamp 64. The positive buss bar 94 is connected to the positive terminal 98.

The test board/stator wire 46 enters the underside 150 of the test board 14 through opening 132 and splits back into three wires 34. Each of the three wires 34 connects to one of the three copper-clad plunge contacts 74a, 74b, 74c. The rectifier 51 makes electrical connection to the plunge contacts 74a, 74b, 74c by contacts 122, 120, 118. Electrical contact to the terminals 96 and 98 from the rectifier 51 is made through the paths previously described.

In the present invention, the conventional brush assembly has been modified to eliminate the ground connection to one of the brushes and to replace it with a connection that isolates the brush assembly from ground.

Referring to FIG. 5, there is shown the modified brush assembly 26 of the drive alternator 12. The modified brush assembly 26 consists of two brushes 160 and 162, the casing 164, brush/test board wire 28, fastening terminal 166, an electrically conductive pin 168, and two wires 170 and 172 for connection to the brushes.

The two brushes 160 and 162 contained in casing 164 make connection to the rotor 24 inside the drive alternator 12. Brush wire 170 is connected between brush 160 and brush/test board wire fastening terminal 166, where electrical contact with a conductor 31 is made. Brush wire 172 is connected between brush 162 and electrical conductive fastening pin 168, which is inserted into a hole 178. In conventional alternators, brush wire 172 is normally connected to a ground contact, which would be located at 180. The modified brush holder 26, by employment of pin 168, provides a structurally sound connection for the conductor 31, which is attached to it, and creates an isolated brush assembly.

The test assembly 10 operates by placing a rectifier 51 known to be good on the rectifier test station 50 and placing a regulator 49 to be tested on the regulator test station 48. The alternator tester 16 spins the drive alternator 12 via a pulley and belt 18, which cause the rotor 24 to rotate, thereby rotating the electromagnetic field. Voltage readings 20 and current readings 22 are displayed by the alternator tester 12 to show if the regulator 49 being tested is functioning at a sufficient level. To test a rectifier 51, it is placed on test station 50, and a good regulator 49 is placed on test station 48. Again, voltage readings 20 and current readings 22 are displayed by the alternator tester 12 to show if rectifier 51 being tested is functioning at a sufficient level. If either the regulator 49 or the rectifier 51 under test is not functioning at a sufficient level, it is discarded and replaced by a new test sample. In this manner, only functioning regulators and rectifiers are placed into a rebuilt alternator.

A latitude of modification, change, and substitution is intended in the foregoing disclosure, and in some instances, some features of the invention will be employed without a corresponding use of other features. Accordingly, it is appropriate that the appended claims be construed broadly and in a manner consistent with the spirit and scope of the invention herein.

What is claimed is:

1. A testing assembly for testing regulators and rectifiers of alternators, comprising:
   a) a drive alternator to be spun by an alternator tester including a dual-conductor wire in place of a regulator and a triple-conductor wire in place of a rectifier, wherein said dual-conductor wire is connected to a modified brush assembly of the drive alternator and wherein said triple-conductor wire is connected to the stator of the drive alternator;
   b) a test board including a regulator test station for receiving and testing a regulator, a rectifier test station for receiving and testing a rectifier, said dual-conductor wire for connection to a brush/test board connector, and said triple-conductor wire for connection to a stator/test board connector;
   c) said regulator test station including regulator clamping means for clamping a test regulator to be tested to said regulator test station, regulator mounting means for mounting said test regulator on said regulator test station, and regulator electrical contact means for electrical contact with said test regulator; and
   d) said rectifier test station including rectifier clamping means for clamping a test rectifier to be tested to said rectifier test station, heat sink means for contacting said test rectifier, rectifier mounting means for mounting said test rectifier on said rectifier test station, and rectifier electrical contact means for electrical contact with said test rectifier.

2. A testing assembly in accordance with claim 1, wherein said modified brush assembly of said drive alternator includes a fastening pin and a fastening terminal for electrically connecting said dual-conductor wire and wherein the ground connection has been removed.

3. A testing assembly in accordance with claim 1, wherein said dual-conductor wire includes an electric wire and first plug.

4. A testing assembly in accordance with claim 3, wherein said brush/test board connector includes said first plug.

5. A testing assembly in accordance with claim 1, wherein said triple-conductor wire includes an electric wire and second plug.

6. A testing assembly in accordance with claim 5, wherein said stator/test board includes said second plug.

7. A testing assembly in accordance with claim 1, wherein said brush/test board connector includes a brush wire and a receptacle.

8. A testing assembly in accordance with claim 1, wherein said stator/test board connector includes a stator wire and a receptacle.

9. A testing assembly in accordance with claim 1, wherein said regulator clamping means includes a spring-activated latch, and a stop, and said regulator mounting means includes mounting pins for receiving said test regulator.

10. A testing assembly in accordance with claim 9, wherein said regulator electrical contact means includes four spring-activated terminals for connection to four electrical contact elements of said test regulator.

11. A testing assembly in accordance with claim 10, wherein said regulator mounting pins make electrical contact with said test regulator and constitute two of the four regulator electrical contact means.

12. A testing assembly in accordance with claim 1, wherein said rectifier clamping means includes a hand-actuated clamp, and a stop, and said rectifier mounting means includes mounting pins for receiving said test rectifier.

13. A testing assembly in accordance with claim 1, wherein said rectifier electrical contact means includes four spring-activated plunge elements for connection to four of the electrical contact elements of said test rectifier.

14. A testing assembly in accordance with claim 1, wherein said rectifier electrical contact means includes three spring-activated plunge elements which are copper clad.

15. A testing assembly in accordance with claim 1, wherein said rectifier heat sink means includes a test station heat sink plate for receiving said test rectifier and for contact to the rectifier heat sink plate.

16. A testing assembly in accordance with claim 15, wherein said rectifier electrical contact means extend through said test station heat sink plate.

17. A testing assembly in accordance with claim 1, wherein said dual-conductor wire is connected to two of four regulator electrical contact elements.

18. A testing assembly in accordance with claim 17, wherein the third one of said regulator electrical contact elements is connected to a positive buss bar and wherein the fourth one of said regulator electrical contact elements is connected via a leaf spring to a fourth one of said rectifier electrical contact elements.

19. A testing assembly in accordance with claim 17, wherein one conductor of said dual-conductor wire along with one of the said regulator electrical contact elements are connected to said test station heat sink plate.

20. A testing assembly in accordance with claim 15, wherein said test station heat sink plate is connected to a negative buss bar and a negative terminal.

21. A testing assembly in accordance with claim 1, wherein said triple-conductor wire is connected to three rectifier electrical contact elements.

22. A testing assembly in accordance with claim 1, wherein said rectifier clamping means is connected to a positive buss bar and a positive terminal.

* * * * *